United States Patent
Tokumaru et al.

(10) Patent No.: US 7,924,188 B2
(45) Date of Patent: Apr. 12, 2011

(54) RAPID RECOVERY CIRCUIT

(75) Inventors: Michiko Tokumaru, Osaka (JP); Heiji Ikoma, Nara (JP)

(73) Assignee: Panasonic Corporation, Osaka (JP)

( * ) Notice: Subject to any disclaimer, the term of this patent is extended or adjusted under 35 U.S.C. 154(b) by 118 days.

(21) Appl. No.: 12/513,776

(22) PCT Filed: Jun. 4, 2008

(86) PCT No.: PCT/JP2008/001421
§ 371 (c)(1),
(2), (4) Date: May 6, 2009

(87) PCT Pub. No.: WO2008/152785
PCT Pub. Date: Dec. 18, 2008

(65) Prior Publication Data
US 2010/0007536 A1    Jan. 14, 2010

(30) Foreign Application Priority Data
Jun. 8, 2007   (JP) .................................. 2007-152839

(51) Int. Cl.
*H03M 1/00* (2006.01)
(52) U.S. Cl. ....................................... 341/135; 330/292
(58) Field of Classification Search .................. 341/135; 330/292, 296; 327/541, 175, 299, 172, 173, 327/174, 108, 109; 307/238, 315; 340/173
See application file for complete search history.

(56) References Cited

U.S. PATENT DOCUMENTS

| | | |
|---|---|---|
| 5,489,902 A | 2/1996 | Shyu et al. |
| 5,530,397 A | 6/1996 | Nakai et al. |
| 6,452,455 B2 * | 9/2002 | Manjrekar et al. ............ 330/292 |
| 2004/0150381 A1 | 8/2004 | Butler |
| 2004/0212421 A1 | 10/2004 | Naka et al. |

FOREIGN PATENT DOCUMENTS

| | | |
|---|---|---|
| JP | 7-130170 | 5/1995 |
| JP | 2004-240943 | 8/2004 |
| JP | 2004-280805 | 10/2004 |
| JP | 2005-339423 | 12/2005 |

* cited by examiner

*Primary Examiner* — Joseph Lauture
(74) *Attorney, Agent, or Firm* — McDermott Will & Emery LLP

(57) ABSTRACT

When a semiconductor circuit, in which a stabilizing capacitor 2 for stabilizing a reference voltage Vbias is connected to a reference voltage terminal RT, recovers from a power down state to an operational state, a current mirror circuit 40 provides current mirroring of a current Ia of a first current path Ph1, which generates an OFF threshold voltage ref1 of a hysteresis comparator 1, to generate a current Ib of a second current path Ph2, which generates the reference voltage Vbias. The reference voltage Vbias is input to the comparator 1 as an input voltage vin. When the reference voltage Vbias becomes equal to the OFF threshold voltage ref1, the comparator 1 immediately stops the charging of the stabilizing capacitor 2 by a current source I1.

31 Claims, 12 Drawing Sheets

Variable current source

RAPID RECOVERY CIRCUIT

RELATED APPLICATIONS

This application is the U.S. National Phase under 35 U.S.C. §371 of International Application No. PCT/JP2008/001421, filed on Jun. 4, 2008, which in turn claims the benefit of Japanese Application No. 2007-152839, filed on Jun. 8, 2007, the disclosures of which Applications are incorporated by reference herein.

TECHNICAL FIELD

The present invention relates to a rapid recovery circuit which is provided in a semiconductor circuit using a stabilizing capacitor to stabilize a reference voltage of a reference voltage terminal, and which enhances the speed at which the semiconductor device recovers from a power down state to an operational state.

BACKGROUND ART

Today, a receiving section and a transmitting section in communication equipment, such as cell phones or wireless LANs, are configured so as to be powered down to save power when communications are not conducted, and so as to be turned on only when transmission and reception are performed. Therefore, semiconductor circuits, such as communication equipment of this type, have a problem in that if it takes time to recover from a power down state to an operational state, a latency time occurs before communications are started.

According to a conventional technique, in a circuit whose circuit characteristics are greatly degraded when noise is mixed with a reference voltage, a stabilizing capacitor is connected to stabilize the reference voltage and thereby reduce the effects of the noise. However, in order for the circuit having such a stabilizing capacitor to recover from a power down state to an operational state, the stabilizing capacitor needs to be charged to a desired reference voltage. A rapid recovery circuit is used to shorten this charging time. However, if the rapid recovery circuit does not turn off in the vicinity of the desired voltage, it will take time for the circuit to settle after the rapid recovery circuit turns off, and the recovery time cannot be reduced further.

Hereinafter, an example of a conventional rapid recovery circuit will be described with reference to FIG. 16.

In FIG. 16, the reference numeral 90 refers to a rapid recovery circuit; 1 to a comparator; 2 to a stabilizing capacitor; 3 to a switch composed of a p-type transistor; ref 1 to a first comparator threshold voltage (from on to off); ref 2 to a second comparator threshold voltage (from off to on); vin to a comparator input; out1 to a first comparator output; Vbias to a reference voltage; I1 to a current source; Ia to a first current path in a semiconductor circuit (not shown), such as communication equipment, to which the reference voltage Vbias is supplied; Ib to a second current path in the semiconductor circuit; and AVDD to a power supply voltage. It is assumed that the first current path Ia and the second current path Ib are the sum total of the current paths connected with the reference voltage Vbias in the circuit. In FIG. 17, the reference characters Vb denote a reference voltage final value, and the reference character T indicates a charging completion time.

In order to reduce effects of noise and the like, the stabilizing capacitor 2 is connected between the reference voltage Vbias and the power supply voltage AVDD. When the semiconductor circuit is in the power down state, the reference voltage Vbias is fixed at the power supply voltage AVDD. Therefore, in order for the semiconductor circuit to recover from the power down state to the normal operational state, the stabilizing capacitor 2 needs to be charged from the power supply voltage AVDD to the reference voltage final value Vb as shown in FIG. 17.

For the purpose of reducing this charging time, the rapid recovery circuit which charges the stabilizing capacitor 2 at a high speed by using the current source I1 is provided. When the semiconductor circuit recovers from the power down state, the current source I1 is turned on by the switch 3, which is controlled by the comparator 1, and charges the stabilizing capacitor 2. As shown in FIG. 17, when the reference voltage Vbias becomes the first comparator threshold voltage ref1 by charging the stabilizing capacitor 2, the comparator 1 turns off the switch 3 to stop the charging by the current source I1. Thereafter, the first current path Ia or the second current path Ib in the semiconductor circuit performs charging or discharging, so that the reference voltage Vbias is stabilized at the reference voltage final value Vb.

Therefore, the charging completion time T of the stabilizing capacitor 2 is obtained as the sum total of the time during which charging is performed by the rapid recovery circuit 90 and the time elapsed between the point at which the rapid recovery circuit 90 starts the OFF operation and the point at which the reference voltage Vbias is stabilized at the reference voltage final value Vb by the first current path Ia or the second current path Ib.

Another configuration for such a rapid recovery circuit is described in Patent Document 1, for example.

Patent Document 1: Japanese Laid-Open Publication No. 2004-280805 (FIG. 5)

DISCLOSURE OF THE INVENTION

Problem that the Invention Intends to Solve

However, the conventional rapid recovery circuit described above has the following drawback. Specifically, in the semiconductor circuit, the first current path Ia and the second current path Ib are such currents as are always consumed during the normal operation as well, and thus cannot be increased very much because of the need for reducing consumption current during the normal operation. Due to this, the charging (or discharging) speed is slow after the rapid recovery circuit 90 turns OFF. Hence, if the reference voltage Vbias at the point in time at which the rapid recovery circuit 90 turns off is fairly different from the reference voltage final value Vb because of the threshold voltage of the comparator 1, a delay or the like, the subsequent charging will take time, causing the circuit's recovery to the normal operation to be delayed by that time.

It is therefore an object of the present invention to provide a rapid recovery circuit which reduces recovery time by lessening effects of a shift in timing when the rapid recovery circuit turns off due to a difference in comparator threshold voltage, a delay or the like.

Means for Solving the Problem

In order to achieve the object, a rapid recovery circuit according to the present invention is configured in such a manner that when a semiconductor circuit recovers from a power down state to an operational state, the rapid recovery circuit turns off at the timing when a reference voltage of a reference voltage terminal of the semiconductor circuit precisely matches a desired voltage.

Specifically, an inventive rapid recovery circuit is a rapid recovery circuit connected with a semiconductor circuit including a reference voltage terminal and a stabilizing capacitor connected with the reference voltage terminal to stabilize a reference voltage of the reference voltage terminal. The inventive rapid recovery circuit includes: a current source for charging the stabilizing capacitor; a comparator which charges the stabilizing capacitor by using the current source when the semiconductor circuit recovers from a power down state to a normal operational state, and stops the charging of the stabilizing capacitor by the current source when the reference voltage of the reference voltage terminal approaches a desired reference voltage as a result of the charging; and a bias circuit. The bias circuit includes: a first current path for generating a threshold voltage according to which the comparator stops the charging of the stabilizing capacitor by the current source; a second current path for generating the reference voltage of the reference voltage terminal; and a current mirror circuit for providing current mirroring of a current of the first current path to the second current path.

In the inventive rapid recovery circuit, the current mirror circuit includes a common current mirror source used for both the first and second current paths.

An inventive rapid recovery circuit is a rapid recovery circuit connected with a semiconductor circuit including a reference voltage terminal and a stabilizing capacitor connected with the reference voltage terminal to stabilize a reference voltage of the reference voltage terminal. The inventive rapid recovery circuit includes: a current source for charging the stabilizing capacitor; a comparator which charges the stabilizing capacitor by using the current source when the semiconductor circuit recovers from a power down state to a normal operational state, and stops the charging of the stabilizing capacitor by the current source when the reference voltage of the reference voltage terminal approaches a desired reference voltage as a result of the charging; and a bias circuit. The bias circuit includes: a first current path for generating a predetermined voltage; a second current path for generating the reference voltage of the reference voltage terminal; a current mirror circuit for providing current mirroring of a current of the first current path to the second current path; a first auxiliary current mirror circuit for providing current mirroring of the current of the first current path, and a second auxiliary current mirror circuit for providing current mirroring of a current of the second current path, the first and second auxiliary current mirror circuits sharing a part of the current mirror circuit; and two resistance elements through which the respective currents generated by the current mirroring by the first and second auxiliary current mirror circuits pass. Two voltages generated by the two resistance elements are used as an input voltage to the comparator and as a threshold voltage according to which the comparator stops the charging of the stabilizing capacitor by the current source.

In the inventive rapid recovery circuit, the current mirror circuit includes a common current mirror source used for both the first and second current paths.

An inventive rapid recovery circuit is a rapid recovery circuit connected with a semiconductor circuit including a reference voltage terminal and a stabilizing capacitor connected with the reference voltage terminal to stabilize a reference voltage of the reference voltage terminal. The inventive rapid recovery circuit includes: a current source for charging the stabilizing capacitor; and a comparator which charges the stabilizing capacitor by using the current source when the semiconductor circuit recovers from a power down state to a normal operational state, and stops the charging of the stabilizing capacitor by the current source when the reference voltage of the reference voltage terminal approaches a desired reference voltage as a result of the charging. The current source includes first and second current sources, and when the comparator charges the stabilizing capacitor by using the first and second current sources, the comparator controls the first and second current sources in such a manner that the first and second current sources are used at first, and thereafter the first current source is stopped to use only the second current source.

In the inventive rapid recovery circuit, the comparator is composed of a hysteresis comparator, and the hysteresis comparator stops the first current source according to the value of a threshold voltage for switching from an OFF operation to an ON operation.

An inventive rapid recovery circuit is a rapid recovery circuit connected with a semiconductor circuit including a reference voltage terminal and a stabilizing capacitor connected with the reference voltage terminal to stabilize a reference voltage of the reference voltage terminal. The inventive rapid recovery circuit includes: a current source for charging the stabilizing capacitor; and a comparator which charges the stabilizing capacitor by using the current source when the semiconductor circuit recovers from a power down state to a normal operational state, and stops the charging of the stabilizing capacitor by the current source when the reference voltage of the reference voltage terminal approaches a desired reference voltage as a result of the charging. The current source is composed of a variable current source whose output current is variable, and the variable current source receives the reference voltage of the reference voltage terminal and is configured so that the value of the output current thereof decreases as the reference voltage approaches the desired reference voltage.

In the inventive rapid recovery circuit, the second current source is composed of a variable current source whose output current is variable, and the variable current source receives the reference voltage of the reference voltage terminal and is configured so that the value of the output current thereof decrease as the reference voltage approaches the desired reference voltage.

An inventive rapid recovery circuit is a rapid recovery circuit connected with a semiconductor circuit including a reference voltage terminal and a stabilizing capacitor connected with the reference voltage terminal to stabilize a reference voltage of the reference voltage terminal. The inventive rapid recovery circuit includes: a current source for charging the stabilizing capacitor; a comparator which charges the stabilizing capacitor by using the current source when the semiconductor circuit recovers from a power down state to a normal operational state, and stops the charging of the stabilizing capacitor by the current source when the reference voltage of the reference voltage terminal approaches a desired reference voltage as a result of the charging; and a forceful stopping means for controlling operation of the current source or of the comparator to forcefully stop the charging of the stabilizing capacitor by the current source when a predetermined amount of time has elapsed since the semiconductor circuit starts recovering to the normal operational state.

The inventive rapid recovery circuit includes a forceful stopping means for stopping operation of the second current source to forcefully stop the charging of the stabilizing capacitor when a predetermined amount of time has elapsed since the semiconductor circuit starts recovering to the normal operational state.

The inventive rapid recovery circuit includes a forceful stopping means for stopping operation of the variable current source to forcefully stop the charging of the stabilizing capacitor when a predetermined amount of time has elapsed since the semiconductor circuit starts recovering to the normal operational state.

An inventive current-steering DA converter includes: one of the rapid recovery circuits described above; a plurality of current sources including transistors whose gates are connected with the reference voltage terminal of the rapid recovery circuit; and a switching circuit for performing switching so as to individually control whether or not to pass each of output currents of the current sources through an analog output line.

An inventive semiconductor integrated circuit includes one of the rapid recovery circuits described above.

Inventive video equipment includes the semiconductor integrated circuit described above.

Inventive communication equipment includes the semiconductor integrated circuit described above.

In the above-described configurations, when the first current path generates the threshold voltage of the comparator, the second current path generates the reference voltage. Therefore, if the threshold voltage is set so that this reference voltage becomes the desired reference voltage that makes the rapid recovery circuit turn off, the rapid recovery circuit reliably performs the OFF operation at the desired reference voltage. As a result, the time required for the subsequent charging is shortened, thereby reducing the time required for the semiconductor circuit to recover from the power down state to the operational state.

Also, according to the invention, since effects of the offset voltage of the comparator are reduced, the rapid recovery circuit performs the OFF operation at the timing when the reference voltage of the reference voltage terminal of the semiconductor circuit more precisely matches the desired voltage.

Furthermore, according to the invention, when the semiconductor circuit recovers from the power down state to the operational state, at first, the first and second current sources are both used to charge the reference voltage terminal of the semiconductor circuit, and thereafter, when the reference voltage of the reference voltage terminal approaches the desired reference voltage, the reference voltage terminal is charged by only using the second current source. Thus, it is possible to enhance the speed at which the reference voltage terminal is charged to the desired reference voltage, while enabling the rapid recovery circuit to perform the OFF operation at an even more precise timing.

In addition, according to the invention, when the semiconductor circuit recovers from the power down state to the operational state, at first, the reference voltage terminal of the semiconductor circuit is charged with a large current from the variable current source, and thereafter, when the reference voltage of the reference voltage terminal approaches the desired reference voltage, the output of the variable current source is adjusted to a smaller current to charge the reference voltage terminal with the smaller current. Thus, it is possible to enhance the speed at which the reference voltage terminal is charged to the desired reference voltage, while enabling the rapid recovery circuit to perform the OFF operation at an even more precise timing.

Moreover, according to the invention, in the recovery process in which the semiconductor circuit recovers from the power down state to the operational state, when a predetermined amount of time has elapsed since the start of the recovery operation, the forceful stopping means forcefully stops the charging of the stabilizing capacitor by the current source, thereby enabling the rapid recovery circuit to perform the OFF operation at the precise timing.

Effects of the invention

As described above, the inventive rapid recovery circuits effectively reduce the time required for the semiconductor circuit to recover from the power down state to the normal operational state.

EXPLANATION OF THE REFERENCE CHARACTERS

Figure 1:
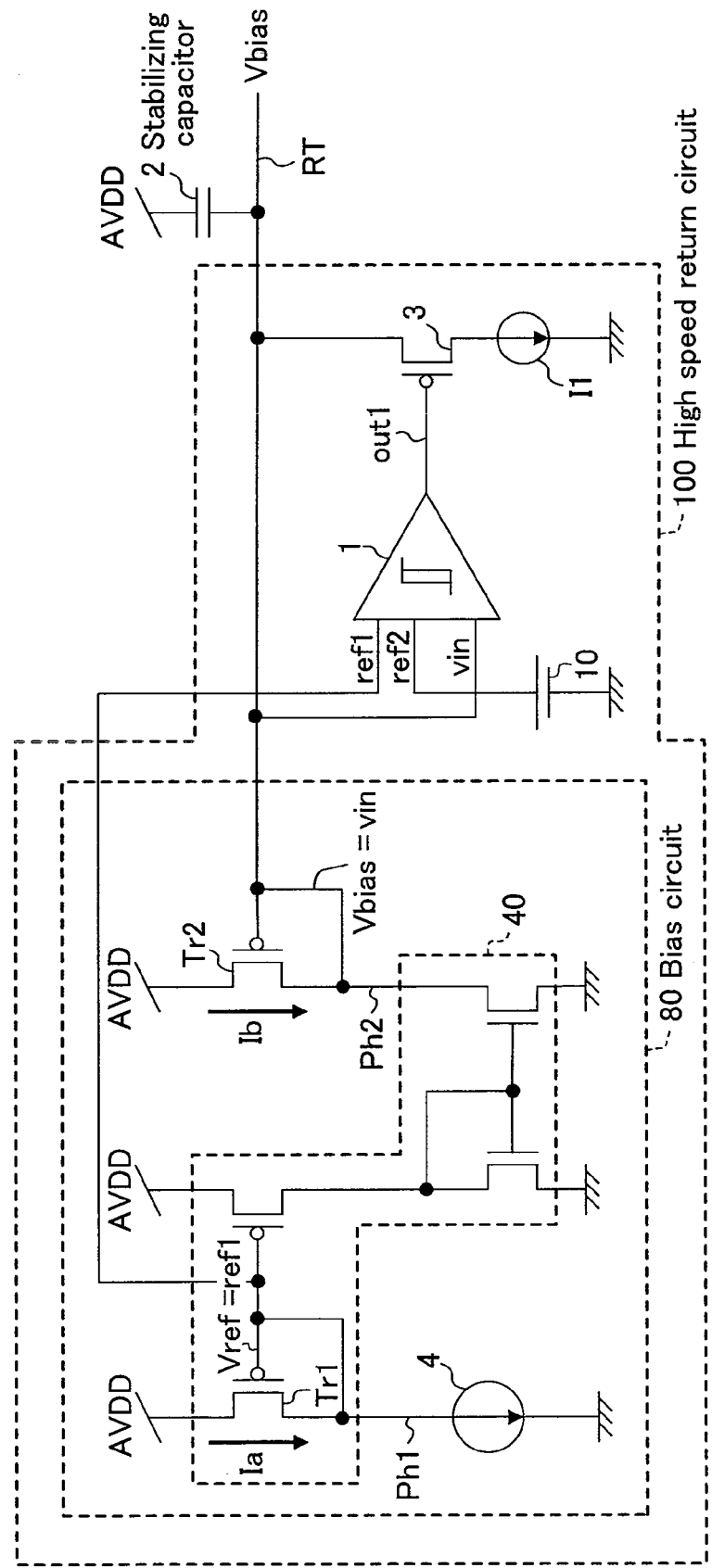
FIG. 1 illustrates the configuration of a rapid recovery circuit according to a first embodiment of the invention.

1 Comparator
2 Stabilizing capacitor
3 Switch
4 Bias current source
5 Second switch
6 Timer
ref1 First threshold voltage
ref2 Second threshold voltage
Vbias Reference voltage
RT Reference voltage terminal I1 First current source
I2 Second current source
I3 Variable current source
Ph1 First current path
Ph2 Second current path
40 Current mirror circuit
40a Common current mirror source
41 First auxiliary current mirror circuit
42 Second auxiliary current mirror circuit
R1, R2 Resistance elements
I01 to I2$^N$ Current sources
50 Switching circuit
51 Analog output line
66 Forceful stopping means
80 Bias circuit
Ia to Ig First to seventh current paths
AVDD Power supply voltage

BEST MODE FOR CARRYING OUT THE INVENTION

Hereinafter, embodiments of the present invention will be described with reference to the accompanying drawings.

First Embodiment

FIG. 1 illustrates the configuration of a rapid recovery circuit according to a first embodiment of the present invention.

In the figure, the reference characters RT denote a reference voltage terminal at which a reference voltage Vbias occurs, and the reference voltage Vbias of the reference voltage terminal RT is connected with a predetermined semiconductor circuit (not shown), such as a current-steering DAC (Digital-Analog Converter), for example. The reference voltage terminal RT is connected with one end of a stabilizing capacitor 2 for the purpose of reducing effects of noise and the like, and the other end of the stabilizing capacitor 2 is connected with a power source AVDD.

The reference numeral 100 denotes the rapid recovery circuit according to this embodiment, and the rapid recovery circuit 100 includes a current source I1 which is connected with the reference voltage terminal RT through a switch 3 composed of a p-type transistor. When the predetermined semiconductor circuit having the reference voltage terminal RT and the stabilizing capacitor 2 recovers from a power down state to a normal operational state, the current source I1 charges the stabilizing capacitor 2 to reduce the recovery time.

The rapid recovery circuit 100 also includes a hysteresis comparator 1 for making the current source I1 perform an ON/OFF operation, and a bias circuit 80. The reference voltage Vbias of the reference voltage terminal RT is input as an input voltage vin to the comparator 1, and an OFF threshold voltage ref1 and an ON threshold voltage ref2, which is provided from a power source 10 (ref 1<ref 2), are also input to the comparator 1. When the input voltage vin (=the reference voltage Vbias) exceeds the ON threshold voltage ref2, the comparator 1 outputs a low-level output signal out1 to make the switch 3 perform the ON operation, thereby charging the stabilizing capacitor 2 by using the current source I1. Thereafter, when the reference voltage Vbias is lowered to fall below the OFF threshold voltage ref1 as a result of charging the stabilizing capacitor 2, the comparator 1 outputs a high-level output signal out1 to make the switch 3 perform the OFF operation, thereby stopping the charging of the stabilizing capacitor 2 by the current source I1.

The bias circuit 80 includes a bias current source 4, a first current path Ph1, which generates a reference voltage Vref by using a p-type transistor Tr1, a second current path Ph2, which generates the reference voltage Vbias of the reference voltage terminal RT by using a p-type transistor Tr2, and a current mirror circuit 40. The current mirror circuit 40 provides "current mirroring" of a current Ia of the first current path Ph1 that generates the reference voltage Vref, thereby generating a current Ib of the second current path Ph2 that generates the reference voltage Vbias.

The reference voltage Vref generated by the first current path Ph1 is input to the comparator 1 as the OFF threshold voltage ref1 of the comparator 1, and the reference voltage Vbias generated by the second current path Ph2 is input to the comparator 1 as the input voltage vin.

Next, an operation according to the first embodiment will be described. When the semiconductor circuit is in the power down state, the reference voltage Vbias of the reference voltage terminal RT is the power supply voltage AVDD. If the reference voltage Vbias during the normal operation is a reference voltage final value Vb indicated in FIG. 2, it is necessary to charge the stabilizing capacitor 2 from the power supply voltage AVDD to the reference voltage final value Vb when the semiconductor circuit recovers from the power down state to the normal operational state. The charging time is the sum total of the time during which the current source I1 performs charging when the rapid recovery circuit is in the ON state, and the time elapsed from the point in time at which the rapid recovery circuit 100 turns off to the point in time at which the reference voltage Vbias is stabilized at the reference voltage final value Vb by the first current path Ia or the second current path Ib.

Figure 2:
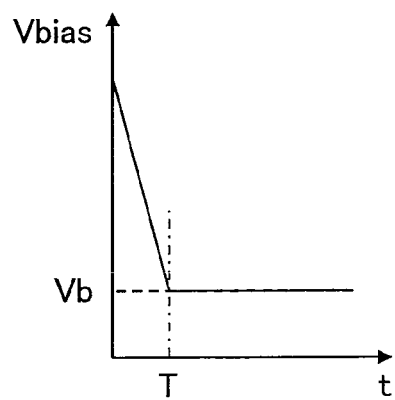
FIG. 2 is a view for explaining operation of the rapid recovery circuit.

The current Ib of the second current path Ph2 that generates the reference voltage Vbias is obtained by providing "current mirroring" of the current Ia of the first current path Ph1 that generates the reference voltage Vref by the current mirror circuit 40. The reference voltage Vref is used as the OFF threshold voltage ref1 of the comparator 1, and the reference voltage Vbias is used as the input voltage vin of the comparator 1. At this time, as shown in FIG. 2, if the reference voltage Vref is set to a voltage which is almost equal to the desired final voltage value Vb of the reference voltage Vbias, the time required for charging after the rapid recovery circuit 100 turns off will be almost zero, thereby greatly shortening the charging completion time T.

Figure 3:
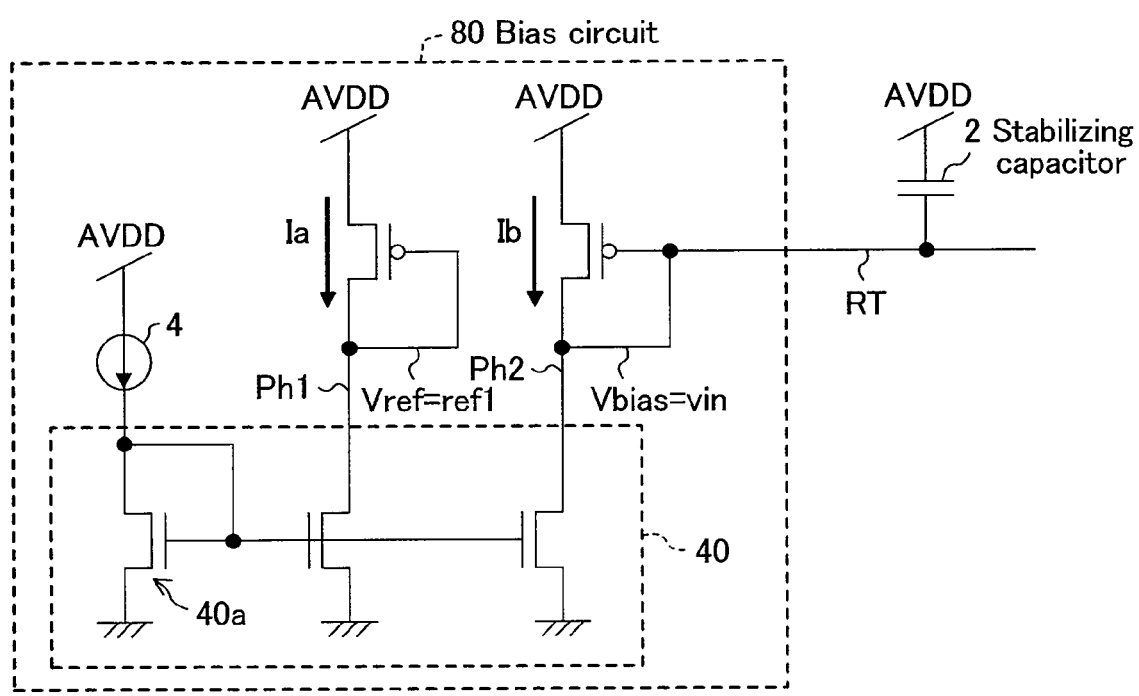
FIG. 3 is a view illustrating a modified example of the rapid recovery circuit.

As shown in FIG. 3, if, in the bias circuit 80, the currents Ia and Ib of the two current paths Ph1 and Ph2 that generate the reference voltage Vbias and the reference voltage Vref are both generated by providing "current mirroring" of a current provided from a common current mirror source 40a, the same effects will also be obtainable.

As described above, in this embodiment, a high speed recovery operation is achievable by using the reference voltage Vref as the OFF threshold voltage ref1 of the comparator 1.

Figure 4:
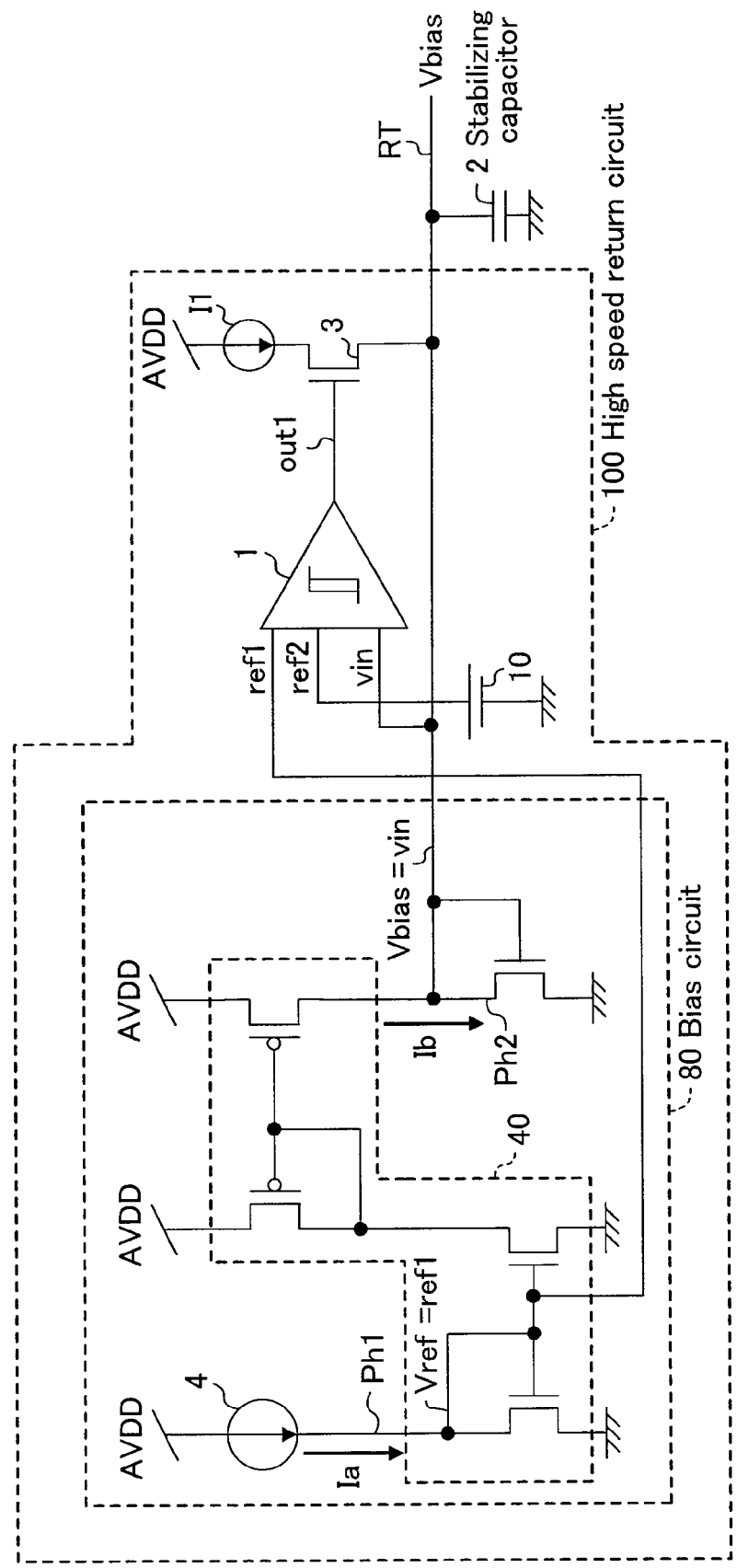
FIG. 4 illustrates an example of the configuration of a rapid recovery circuit in which a stabilizing capacitor is located between a reference voltage terminal and a ground.

In this embodiment, the stabilizing capacitor 2 for the reference voltage terminal RT is located between the reference voltage terminal RT and the power source AVDD, but may be connected between the reference voltage terminal RT and a ground. FIG. 4 illustrates the configuration of a rapid recovery circuit 100 in that case. In FIG. 4, a current source I1 is connected between a reference voltage terminal RT and a power source AVDD. And a switch 3 is composed of an Nch transistor instead of a Pch transistor.

Second Embodiment

Figure 5:
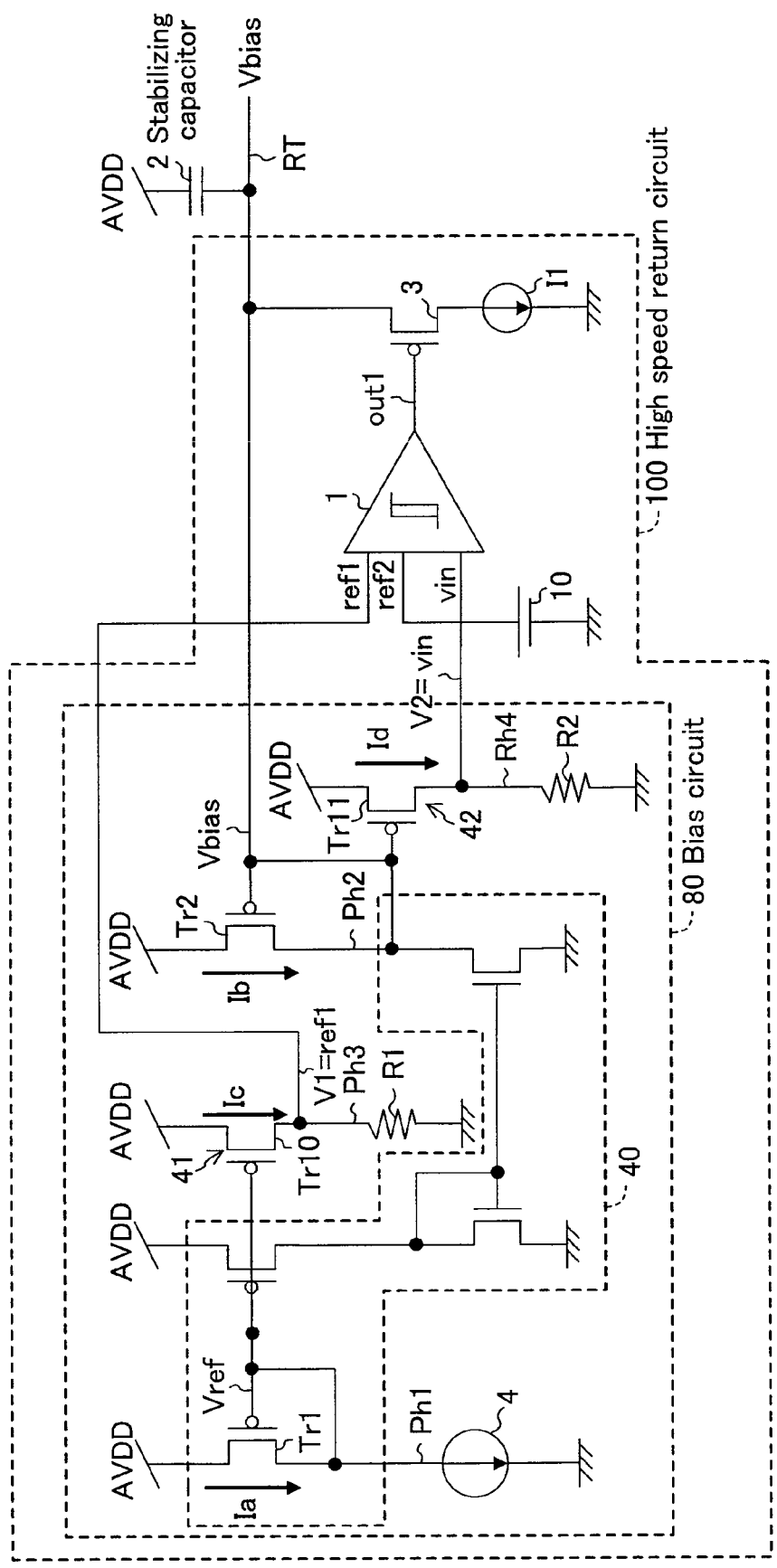
FIG. 5 illustrates the configuration of a rapid recovery circuit according to a second embodiment of the invention.

FIG. 5 illustrates the configuration of a rapid recovery circuit according to a second embodiment of the present invention.

In FIG. 5 showing this embodiment, in a bias circuit 80, a current Ic of a third current path Ph3, which is generated by a first auxiliary current mirror circuit 41 including two p-type transistors Tr1 and Tr10 by "current mirroring" of a current Ia of a first current path Ph1, is passed through a first resistance element R1, while a current Id of a fourth current path Ph4, which is generated by a second auxiliary current mirror circuit 42 including two p-type transistors Tr2 and Tr11 by "current mirroring" of a current Ib of a second current path Ph2, is passed through a second resistance element R2.

The voltage generated by the passage of the current Ic through the first resistance element R1 is V1, and the voltage generated by the passage through the second resistance element R2 is V2. And the voltage V1 is used as an OFF threshold voltage ref1 of a comparator 1, and the voltage V2 is used as an input voltage vin of the comparator 1.

When a semiconductor circuit recovers from a power down state to a normal operation, a stabilizing capacitor 2 needs to be charged from a power supply voltage AVDD to the reference voltage final value Vb shown in FIG. 2. If a reference voltage Vbias when the rapid recovery circuit 100 turns off is equal to the reference voltage final value Vb as much as possible, the recovery time can be reduced. However, since the comparator 1 typically has an offset voltage Voff, the output signal may not change from the low level to the high level at the desired timing.

In this embodiment, the first voltage V1 is used as the OFF threshold voltage ref1 of the comparator 1, and the second voltage V2 is used as the input voltage vin of the comparator 1. Thus, the effects of the offset voltage Voff of the comparator 1 are reduced. Hereinafter, this will be described in detail.

The detailed description will be given by illustrating a case, such as a current-steering DAC as a semiconductor circuit, in which the reference voltage Vbias is input to the gates of transistors and used as current output. To be specific, a case in which the rapid recovery circuit of this embodiment is included in a current-steering DAC will be discussed below.

Figure 6:
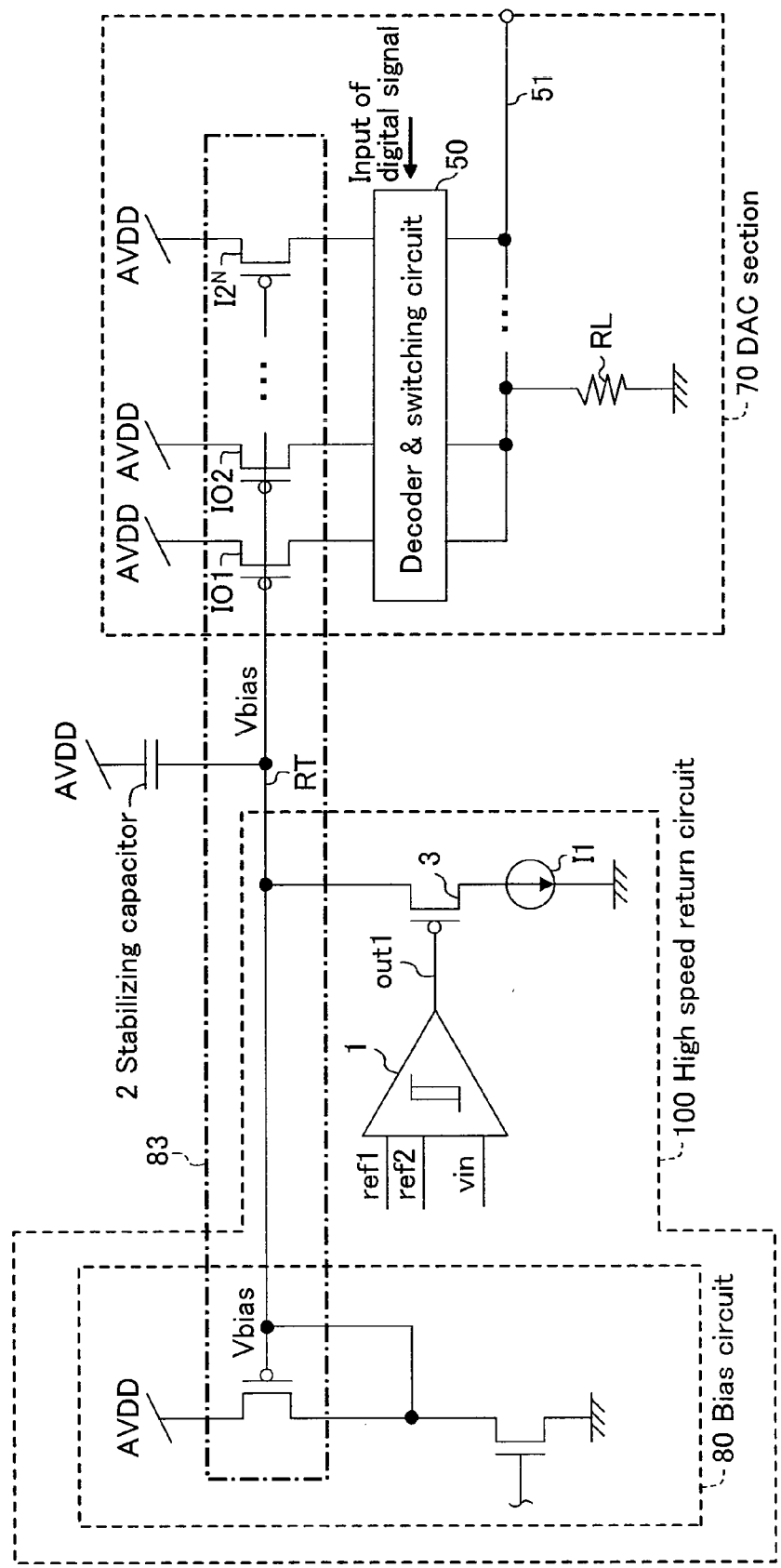
FIG. 6 illustrates the configuration of a current-steering DAC including the rapid recovery circuit.

A current-steering DAC shown in FIG. 6 includes a DAC section 70. The DAC section 70 is used for N-bit current addition and includes current sources I01 to I2$^N$ which are composed of p-type transistors and the number of which is the N-th power of 2. These current sources I01 to I2$^N$ are connected with a decoder & switching circuit (a switching circuit) 50. The decoder & switching circuit 50 receives an N-bit digital signal, converts the digital signal to an analog signal, controls by using an internal switch (not shown) whether or not each of the current sources I01 to I2$^N$ should be connected with an analog output line 51 according to this analog signal, and passes currents gathering in the analog output line 51 through a load resistance RL, thereby obtaining an analog output voltage in the analog output line 51.

The current sources I01 to I2$^N$, together with a p-type transistor in a bias circuit 80, which supplies a bias voltage Vbias to the gate terminals of the p-type transistors forming the current sources I01 to I2$^N$, form a current mirror circuit 83. If noise is put on the bias voltage Vbias, the output characteristics of the current-steering DAC will be degraded. Thus, in order to prevent such degradation in the characteristics, a stabilizing capacitor 2 is connected with a wire (a reference voltage terminal) of the bias voltage Vbias.

Now, in this current-steering DAC, in a situation where an offset voltage Voff is occurring in a comparator 1 in a rapid recovery circuit 100 connected with the reference voltage terminal RT, comparisons are made between when the bias circuit 80 shown in FIG. 1 is used and when the bias circuit 80 shown in FIG. 5 is used.

A variation in current, i.e., a difference between current values in the current sources in the current-steering DAC in FIG. 1 occurring when the rapid recovery circuit performs the OFF operation is $$\Delta Ids1/Ids1 = ((Veff - Voff)/Veff)^2$$

where Ids1 is the output current of each current source in FIG. 1. It should be noted that Veff is the effective voltage of the transistors.

On the other hand, in FIG. 5 according to this embodiment, a current variation in the current sources is $$\Delta Ids2/Ids2 = (V1 - Voff)/V1$$

where the first voltage V1 and the second voltage V2 are the OFF threshold voltage ref1 of the comparator 1 and the input voltage vin of the comparator 1, respectively, and Ids2 is the output current of each current source in FIG. 5.

If Voff=10 mV, Veff=0.3 V, and V1=2V, for example, $$\Delta Ids1/Ids1 = 1 - (0.29/0.3)^2 = -6.6\% \text{ and}$$

$$\Delta Ids2/Ids2 = 1 - 1.99/2 = -0.5\%$$

Therefore, in this example, it is found that the effect of the offset voltage Voff of the comparator 1 on the current variation is reduced to less than one tenth.

In this manner, a high speed recovery is achieved by using the first voltage V1 as the OFF threshold voltage ref1 of the comparator 1, and the second voltage V2 as the input voltage vin of the comparator 1.

In this embodiment, the current-steering DAC including the rapid recovery circuit 100 has been described. Nevertheless, the present invention is not limited to the current-steering DAC, but may be applicable to semiconductor integrated circuits, video systems, or communication equipment having various functions.

Third Embodiment

Figure 7:
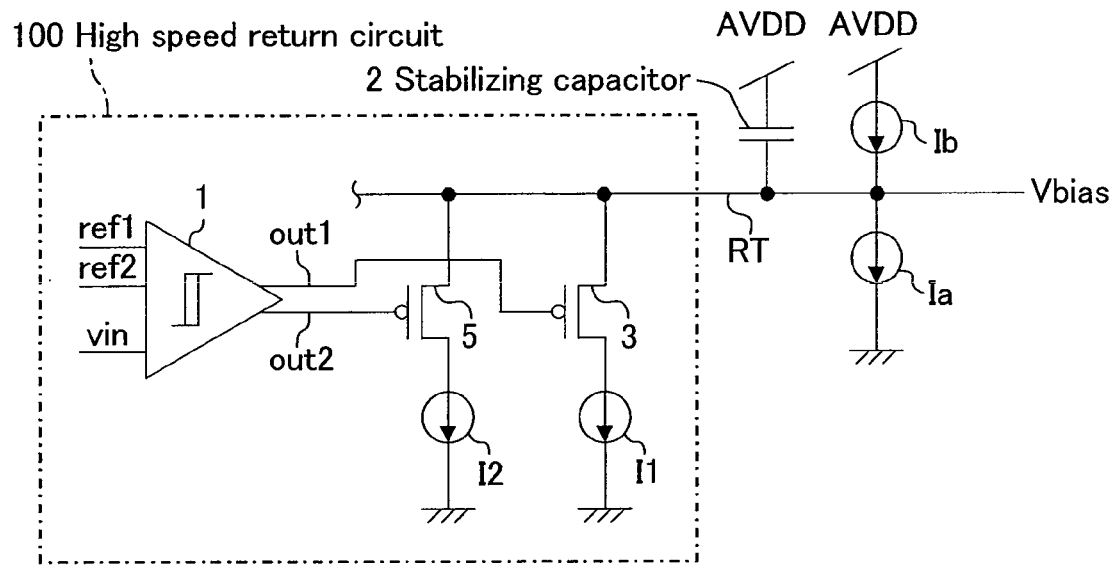
FIG. 7 illustrates the configuration of a rapid recovery circuit according to a third embodiment of the invention.

FIG. 7 illustrates the configuration of a rapid recovery circuit according to a second embodiment of the present invention.

In FIG. 7, a reference voltage terminal RT, to which a stabilizing capacitor 2 is connected, is connected with a first current source I1 through a first switch 3, and with a second current source I2 through a second switch 5.

In a process in which a semiconductor circuit recovers from a power down state to a normal operational state, at the beginning of the process, that is, when an input voltage vin (a reference voltage Vbias of the reference voltage terminal RT=a power supply voltage AVDD) is higher than an ON threshold voltage ref2, a hysteresis comparator 1 outputs low-level first and second output signals out1 and out2 to cause the two switches 3 and 5 composed of p-type transistors to perform the ON operation, thereby charging the stabilizing capacitor 2 of the reference voltage terminal RT by the first and second current sources I1 and I2. Thereafter, when the reference voltage Vbias is lowered by this charging operation and reaches the ON threshold voltage ref2, the hysteresis comparator 1 puts the first output signal out1 to the high level to cause the first switch 3 to turn off so as to stop the charging of the stabilizing capacitor 2 by the first current source I1, whereby the stabilizing capacitor 2 continues to be charged by only using the second current source I2. And when the reference voltage Vbias is further reduced to reach an OFF threshold voltage ref1, the hysteresis comparator 1 puts the second output signal out2 to the high level to cause the second switch 5 to turn off, thereby stopping charging of the stabilizing capacitor 2 by the second current source I2 as well.

Therefore, in this embodiment, when the semiconductor circuit recovers from the power down state to the normal operational state, the charging time can be reduced more as the current sources used in charging the stabilizing capacitor 2 are larger. Nevertheless, in a case where the timing when the comparator 1 turns off is shifted due to a delay time td of the comparator 1 shown in FIG. 8 or the like, as the values of currents caused to flow by the current sources are larger, the reference voltage Vbias goes beyond a reference voltage final value Vb to a larger extent as shown by a thin line in FIG. 8, resulting in a longer charging completion time T'. However, if the currents are reduced, the recovery time will be longer.

Figure 8:
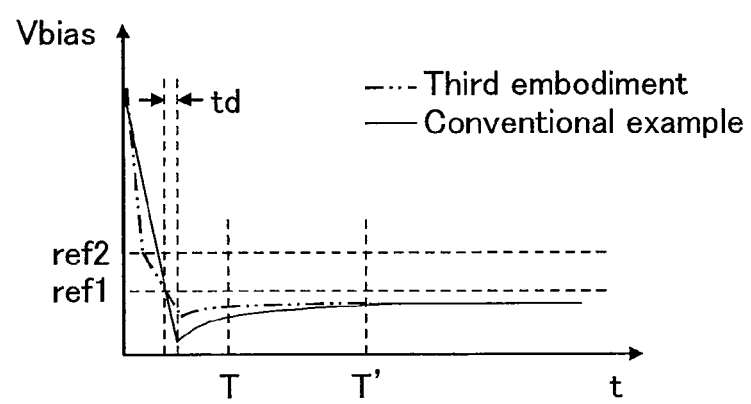
FIG. 8 is a view for explaining operation of the rapid recovery circuit.

In this embodiment, as indicated by the two-dot chain line in FIG. 8, at first, charging is performed with large currents by using the two current sources I1 and I2, and when the charging process has reached a certain level, charging is performed with a small current by only using the second current source I2. It is thus possible to turn off the rapid recovery circuit 100 at a more precise timing, so that a charging completion time T is shortened as compared to the completion time T', thereby reducing the time required for the semiconductor circuit to recover from the power down state to the normal operational state.

It should be noted that this embodiment will become more effective when combined with the first and second embodiments.

Fourth Embodiment

Figure 9:
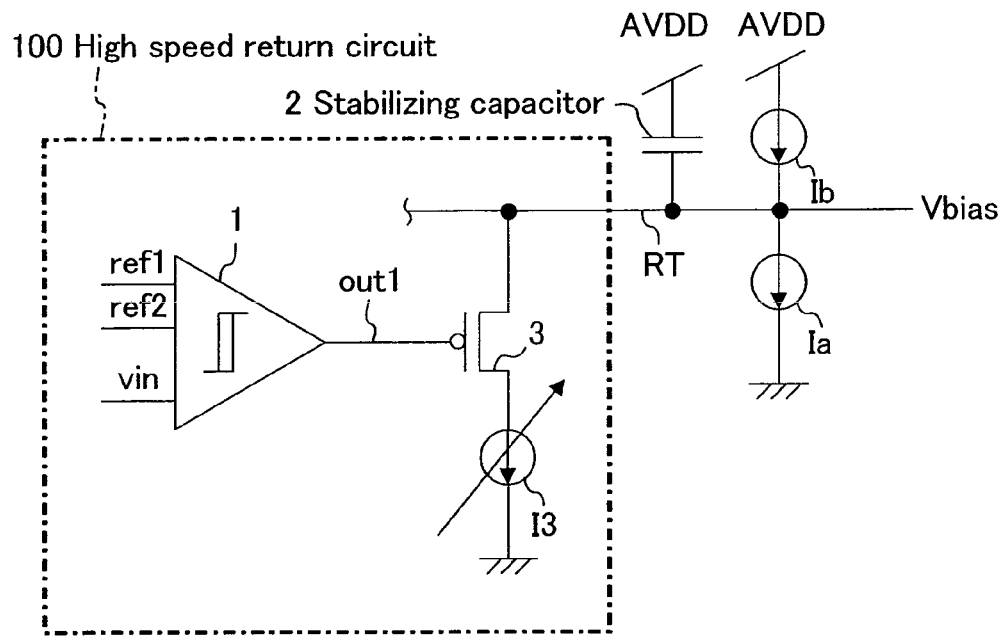
FIG. 9 illustrates the configuration of a rapid recovery circuit according to a fourth embodiment of the invention.

FIG. 9 illustrates the configuration of a rapid recovery circuit according to a fourth embodiment of the present invention.

This embodiment is characterized by a configuration in which a current source I3 is not a fixed current source whose output current value is a fixed value, but is a variable current source whose output current can be adjusted variably.

Figure 10:
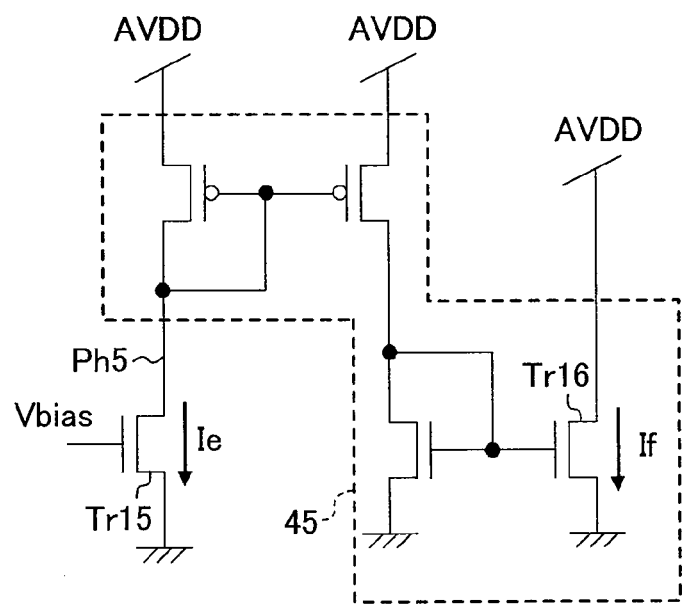
FIG. 10 illustrates the internal configuration of a variable current source included in the rapid recovery circuit.

FIG. 10 illustrates the internal configuration of the variable current source I3. In FIG. 10, the variable current source I3 includes an n-type transistor Tr15, which receives at the gate thereof a reference voltage Vbias of a reference voltage terminal RT, and a current mirror circuit 45, which performs "current mirroring" of a current Ie flowing through the transistor Tr15. The variable current source I3 is configured so as to output as an output current a current If obtained by the current mirroring and flowing through an n-type transistor Tr16 forming a part of the current mirror circuit 45.

Thus, in the variable current source I3 shown in FIG. 10, as the reference voltage Vbias of the reference voltage terminal RT is lowered by charging a stabilizing capacitor 2 by the variable current source I3, the value of the current Ie flowing through the n-type transistor Tr15 is decreased, and hence the output current If obtained by the current mirroring of this current Ie is also gradually limited to a smaller value in accordance with the lowering of the reference voltage Vbias.

Figure 11:
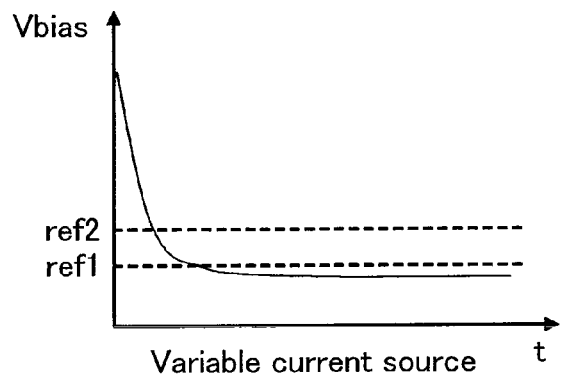
FIG. 11 is a view for explaining operation of the rapid recovery circuit.

Accordingly, in this embodiment as in the third embodiment, as shown in FIG. 11, charging is performed with a large current at first, and as the reference voltage Vbias of the reference voltage terminal RT approaches a reference voltage final value Vb, the output current value of the variable current source I3 is decreased. This allows the rapid recovery circuit 100 to be turned off at a more precise timing, so that the time required for recovering from the power down state to the normal operational state is shortened.

It should be noted that this embodiment will become more effective when combined with the first and second embodiments.

Figure 12:
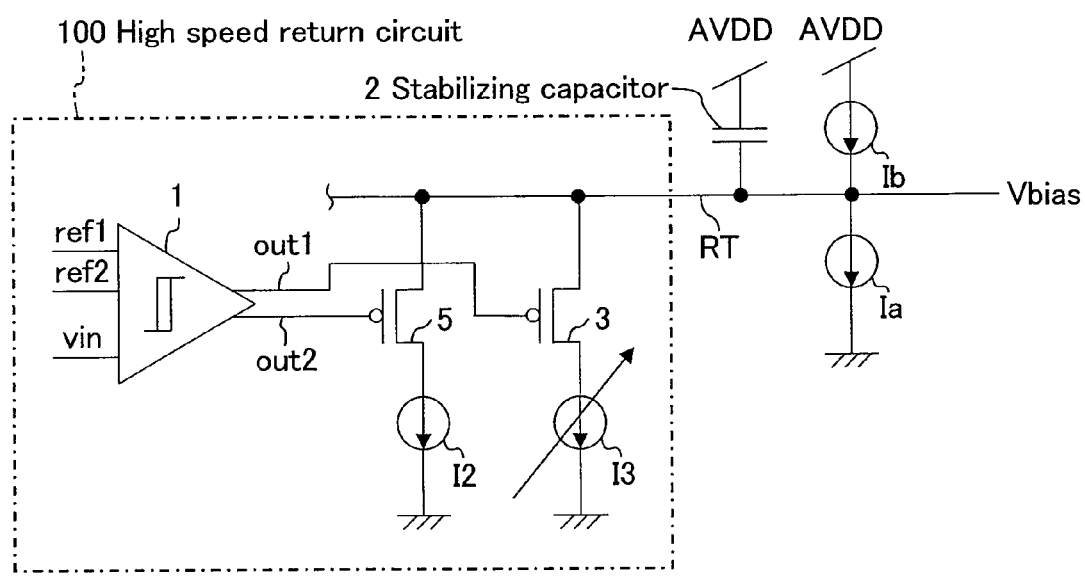
FIG. 12 is a view illustrating a modified example of the rapid recovery circuit.
Figure 13:
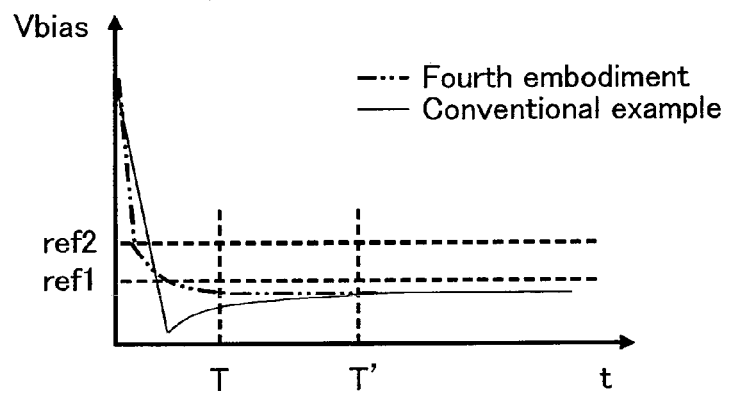
FIG. 13 is a view for explaining operation of the rapid recovery circuit.

Of the first and second current sources I1 and I2 illustrated in FIG. 7 of the third embodiment, the first current source I1 may be replaced with the variable current source I3 as shown in FIG. 12. FIG. 13 shows operation performed in this case.

Fifth Embodiment

Figure 14:
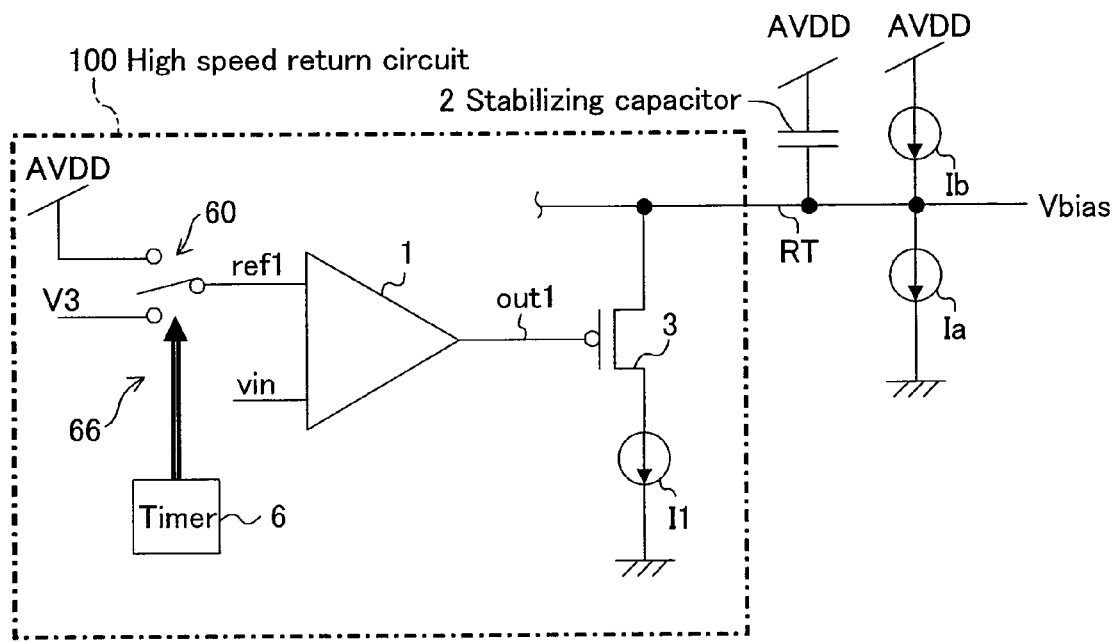
FIG. 14 illustrates the configuration of a rapid recovery circuit according to a fifth embodiment of the invention.

FIG. 14 illustrates the configuration of a rapid recovery circuit according to a fifth embodiment of the present invention.

In the rapid recovery circuit 100 illustrated in FIG. 14, the reference numeral 6 indicates a timer, and the reference numeral 60 denotes a switch. The switch 60 switches between a desired final voltage value V3 of a reference voltage Vbias of a reference voltage terminal RT, which makes the rapid recovery circuit 100 perform the OFF operation, and a power supply voltage AVDD, and inputs either the desired final voltage value V3 or the power supply voltage AVDD as a threshold voltage ref1 of a comparator 1. The switch 60 is normally switched to the desired final voltage value V3 position. The comparator 1 is not composed of a hysteresis comparator, but is composed of an ordinary comparator.

On the other hand, the timer 6 starts counting when a semiconductor circuit starts recovering from a power down state to a normal operational state, and when a predetermined amount of time has elapsed, the timer 6 outputs a control signal to the switch 6 so that the switch 60 switches from the desired final voltage value V3 position to the power supply voltage AVDD position.

The timer 6 and the switch 60 form a forceful stopping means 66. When the predetermined amount of time has elapsed since the semiconductor circuit starts recovering to the normal operational state, the forceful stopping means 66 controls the operation of the comparator 1 in such a manner that the comparator 1 outputs a high-level output signal out1, thereby turning off a p-type transistor 3 and forcefully stopping the charging of a stabilizing capacitor 2 by a current source I1.

Figure 15:
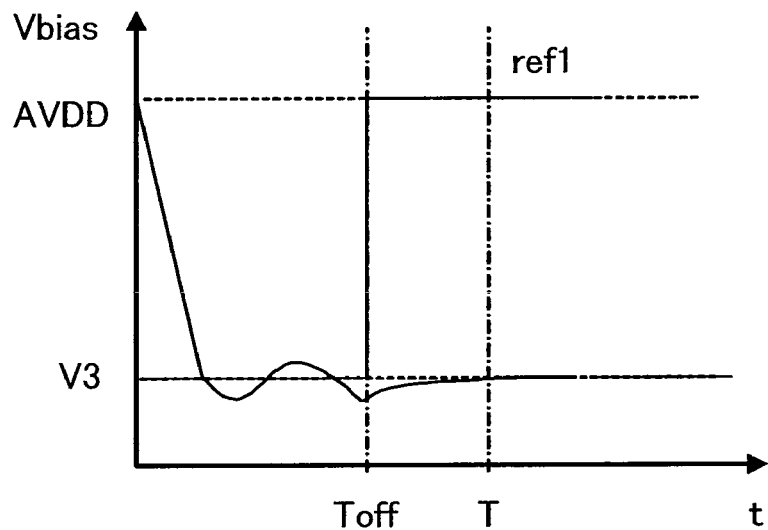
FIG. 15 is a view for explaining operation of the rapid recovery circuit.
Figure 16:
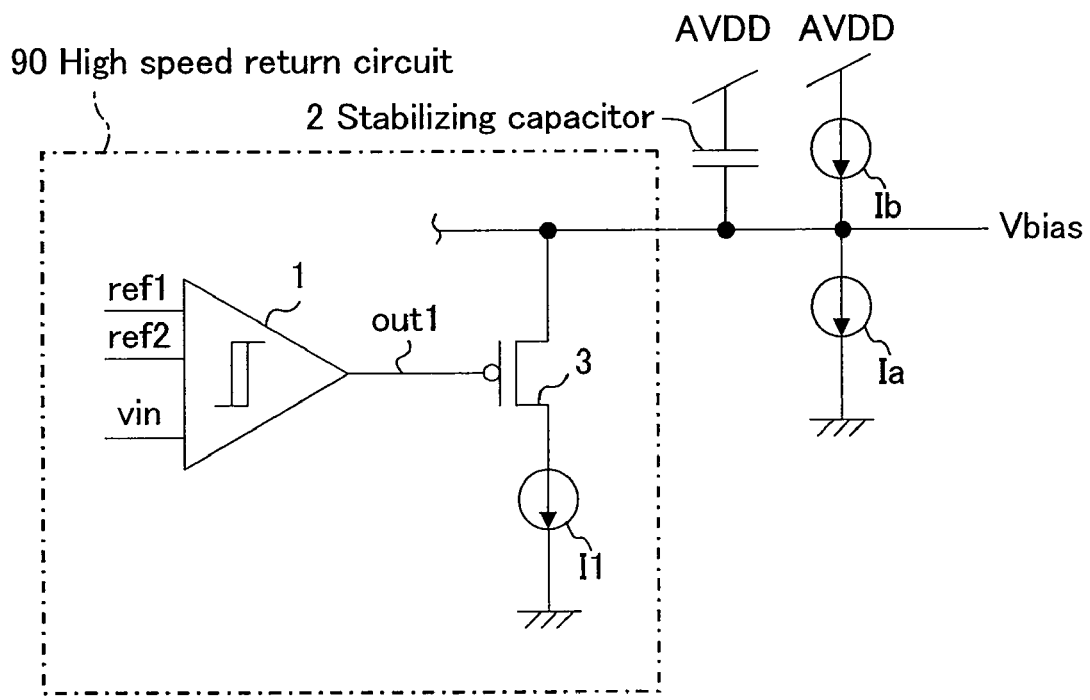
FIG. 16 illustrates the configuration of a conventional rapid recovery circuit.
Figure 17:
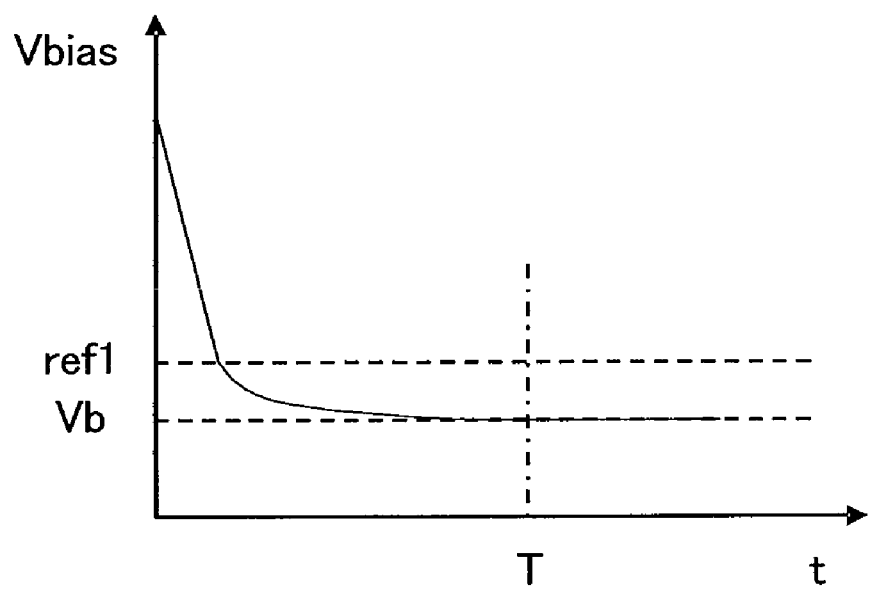
FIG. 17 is a view for explaining operation of the conventional rapid recovery circuit.

Accordingly, in this embodiment, the timer 6 determines the timing when the rapid recovery circuit 100 is turned off. As shown in FIG. 15, when an ordinary comparator 1 is used, the comparator 1 repeatedly turns on and off in the vicinity of the threshold voltage ref1 of the comparator 1. If the predetermined amount of time (which is denoted as a timer-off time Toff in FIG. 15) is set so that the first current source I1 turns off at this time, the rapid recovery circuit 100 turns off in the vicinity of the reference voltage final value Vb, thereby enabling the recovery time to be reduced.

In this embodiment, the comparator 1 is controlled so as to turn off the current source I1, but it will easily be appreciated that the current source I1 may be controlled directly.

This embodiment will become more effective when combined with the first to fourth embodiments.

Figure 18:
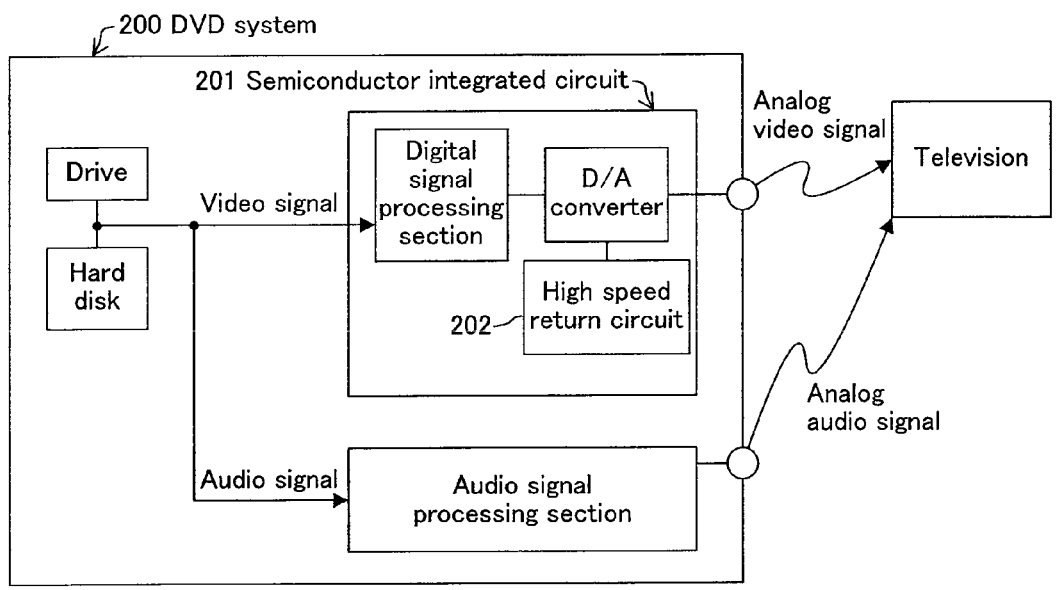
FIG. 18 illustrates an example of a semiconductor integrated circuit and video equipment in which a rapid recovery circuit of the invention is used.

FIG. 18 illustrates an example of a semiconductor integrated circuit and video equipment in which a rapid recovery circuit described in the first to fourth embodiments is used.

In FIG. 18, a DVD system 200 is illustrated as the video equipment. In this DVD system 200, a digital video signal read from a DVD drive or from a hard disk is processed by a digital signal processing section in the semiconductor integrated circuit 201, the processed digital signal is then converted to an analog signal by a D/A converter, and the analog signal is transmitted as an analog video signal to a TV, for example. The rapid recovery circuit (denoted by the reference numeral 202) described so far according to the present invention reduces the time required for startup of the D/A converter, thereby reducing the latency time of the output of the video signal.

Figure 19:
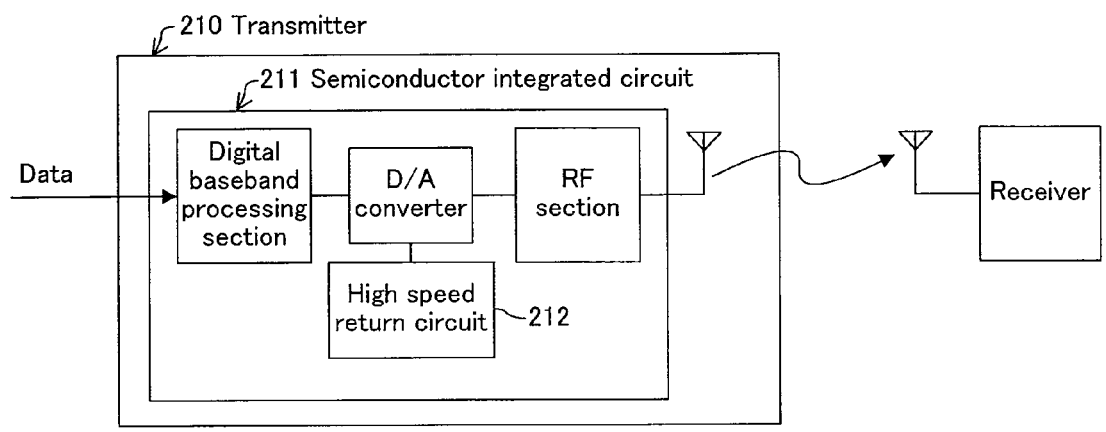
FIG. 19 illustrates an example of a semiconductor integrated circuit and communication equipment in which a rapid recovery circuit of the invention is used.

FIG. 19 illustrates an example of a semiconductor integrated circuit and communication equipment in which a rapid recovery circuit described in the first to fourth embodiments is used.

In FIG. 19, as in the video equipment (the DVD system 200), in a transmitter 210 as the communication equipment, input data is subjected to digital baseband processing in the semiconductor integrated circuit 211, the processed data is then subjected to a digital-to-analog conversion in a D/A converter, and the obtained data is transmitted as an analog signal from an antenna through a RF section and received by an antenna of a receiver. The rapid recovery circuit (denoted by the reference numeral 212) described so far according to the present invention reduces the time required for startup of the D/A converter, thereby reducing the latency time of the transmission of the transmission signal.

INDUSTRIAL APPLICABILITY

As described above, the present invention enables a semiconductor circuit to recover from a power down state to a normal operational state at an even higher speed even when a stabilizing capacitor is connected with a reference voltage terminal of the semiconductor circuit, and is thus applicable to rapid recovery circuits used in such semiconductor circuits.

The invention claimed is:

1. A rapid recovery circuit connected with a semiconductor circuit including a reference voltage terminal and a stabilizing capacitor connected with the reference voltage terminal to stabilize a reference voltage of the reference voltage terminal, the rapid recovery circuit comprising:
a current source for charging the stabilizing capacitor;
a comparator which charges the stabilizing capacitor by using the current source when the semiconductor circuit recovers from a power down state to a normal operational state, and stops the charging of the stabilizing capacitor by the current source when the reference voltage of the reference voltage terminal approaches a desired reference voltage as a result of the charging; and
a bias circuit,
wherein the bias circuit includes
a first current path for generating a threshold voltage according to which the comparator stops the charging of the stabilizing capacitor by the current source;
a second current path for generating the reference voltage of the reference voltage terminal; and
a current mirror circuit for providing current mirroring of a current of the first current path to the second current path.

2. The rapid recovery circuit of claim 1, wherein the current mirror circuit includes a common current mirror source used for both the first and second current paths.

3. A current-steering DA converter comprising:
the rapid recovery circuit of claim 1;
a plurality of current sources including transistors whose gates are connected with the reference voltage terminal of the rapid recovery circuit; and
a switching circuit for performing switching so as to individually control whether or not to pass each of output currents of the current sources through an analog output line.

4. The rapid recovery circuit of claim 3, further comprising:
a forceful stopping means for stopping operation of the second current source to forcefully stop the charging of the stabilizing capacitor when a predetermined amount of time has elapsed since the semiconductor circuit starts recovering to the normal operational state.

5. A semiconductor integrated circuit comprising the rapid recovery circuit of claim 1.

6. Video equipment comprising the semiconductor integrated circuit of claim 5.

7. Communication equipment comprising the semiconductor integrated circuit of claim 5.

8. A rapid recovery circuit connected with a semiconductor circuit including a reference voltage terminal and a stabilizing capacitor connected with the reference voltage terminal to stabilize a reference voltage of the reference voltage terminal, the rapid recovery circuit comprising:
a current source for charging the stabilizing capacitor;
a comparator which charges the stabilizing capacitor by using the current source when the semiconductor circuit recovers from a power down state to a normal operational state, and stops the charging of the stabilizing capacitor by the current source when the reference voltage of the reference voltage terminal approaches a desired reference voltage as a result of the charging; and
a bias circuit,
wherein the bias circuit includes
a first current path for generating a predetermined voltage;
a second current path for generating the reference voltage of the reference voltage terminal;
a current mirror circuit for providing current mirroring of a current of the first current path to the second current path;
a first auxiliary current mirror circuit for providing current mirroring of the current of the first current path, and a second auxiliary current mirror circuit for providing current mirroring of a current of the second current path, the first and second auxiliary current mirror circuits sharing a part of the current mirror circuit; and
two resistance elements through which the respective currents generated by the current mirroring by the first and second auxiliary current mirror circuits pass; and
two voltages generated by the two resistance elements are used as an input voltage to the comparator and as a threshold voltage according to which the comparator stops the charging of the stabilizing capacitor by the current source.

9. The rapid recovery circuit of claim 8, wherein the current mirror circuit includes a common current mirror source used for both the first and second current paths.

10. A current-steering DA converter comprising:
the rapid recovery circuit of claim 8;
a plurality of current sources including transistors whose gates are connected with the reference voltage terminal of the rapid recovery circuit; and
a switching circuit for performing switching so as to individually control whether or not to pass each of output currents of the current sources through an analog output line.

11. A semiconductor integrated circuit comprising the rapid recovery circuit of claim 8.

12. Video equipment comprising the semiconductor integrated circuit of claim 11.

13. Communication equipment comprising the semiconductor integrated circuit of claim 11.

14. A rapid recovery circuit connected with a semiconductor circuit including a reference voltage terminal and a stabilizing capacitor connected with the reference voltage terminal to stabilize a reference voltage of the reference voltage terminal, the rapid recovery circuit comprising:

a current source for charging the stabilizing capacitor; and a comparator which charges the stabilizing capacitor by using the current source when the semiconductor circuit recovers from a power down state to a normal operational state, and stops the charging of the stabilizing capacitor by the current source when the reference voltage of the reference voltage terminal approaches a desired reference voltage as a result of the charging, wherein the current source includes first and second current sources; and when the comparator charges the stabilizing capacitor by using the first and second current sources, the comparator controls the first and second current sources in such a manner that the first and second current sources are used at first, and thereafter the first current source is stopped to use only the second current source.

15. The rapid recovery circuit of claim 14, wherein the comparator is composed of a hysteresis comparator; and the hysteresis comparator stops the first current source according to the value of a threshold voltage for switching from an OFF operation to an ON operation.

16. The rapid recovery circuit of claim 14, wherein the second current source is composed of a variable current source whose output current is variable; and the variable current source receives the reference voltage of the reference voltage terminal and is configured so that the value of the output current thereof decrease as the reference voltage approaches the desired reference voltage.

17. The rapid recovery circuit of claim 16, further comprising:

a forceful stopping means for stopping operation of the variable current source to forcefully stop the charging of the stabilizing capacitor when a predetermined amount of time has elapsed since the semiconductor circuit starts recovering to the normal operational state.

18. A current-steering DA converter comprising:

the rapid recovery circuit of claim 14;

a plurality of current sources including transistors whose gates are connected with the reference voltage terminal of the rapid recovery circuit; and a switching circuit for performing switching so as to individually control whether or not to pass each of output currents of the current sources through an analog output line.

19. A semiconductor integrated circuit comprising the rapid recovery circuit of claim 14.

20. Video equipment comprising the semiconductor integrated circuit of claim 19.

21. Communication equipment comprising the semiconductor integrated circuit of claim 19.

22. A rapid recovery circuit connected with a semiconductor circuit including a reference voltage terminal and a stabilizing capacitor connected with the reference voltage terminal to stabilize a reference voltage of the reference voltage terminal, the rapid recovery circuit comprising:

a current source for charging the stabilizing capacitor; and a comparator which charges the stabilizing capacitor by using the current source when the semiconductor circuit recovers from a power down state to a normal operational state, and stops the charging of the stabilizing capacitor by the current source when the reference voltage of the reference voltage terminal approaches a desired reference voltage as a result of the charging, wherein the current source is composed of a variable current source whose output current is variable; and the variable current source receives the reference voltage of the reference voltage terminal and is configured so that the value of the output current thereof decreases as the reference voltage approaches the desired reference voltage.

23. A current-steering DA converter comprising:

the rapid recovery circuit of claim 22;

a plurality of current sources including transistors whose gates are connected with the reference voltage terminal of the rapid recovery circuit; and a switching circuit for performing switching so as to individually control whether or not to pass each of output currents of the current sources through an analog output line.

24. A semiconductor integrated circuit comprising the rapid recovery circuit of claim 22.

25. Video equipment comprising the semiconductor integrated circuit of claim 24.

26. Communication equipment comprising the semiconductor integrated circuit of claim 24.

27. A rapid recovery circuit connected with a semiconductor circuit including a reference voltage terminal and a stabilizing capacitor connected with the reference voltage terminal to stabilize a reference voltage of the reference voltage terminal, the rapid recovery circuit comprising:

a current source for charging the stabilizing capacitor;

a comparator which charges the stabilizing capacitor by using the current source when the semiconductor circuit recovers from a power down state to a normal operational state, and stops the charging of the stabilizing capacitor by the current source when the reference voltage of the reference voltage terminal approaches a desired reference voltage as a result of the charging; and a forceful stopping means for controlling operation of the current source or of the comparator to forcefully stop the charging of the stabilizing capacitor by the current source when a predetermined amount of time has elapsed since the semiconductor circuit starts recovering to the normal operational state.

28. A current-steering DA converter comprising:

the rapid recovery circuit of claim 27;

a plurality of current sources including transistors whose gates are connected with the reference voltage terminal of the rapid recovery circuit; and a switching circuit for performing switching so as to individually control whether or not to pass each of output currents of the current sources through an analog output line.

29. A semiconductor integrated circuit comprising the rapid recovery circuit of claim 27.

30. Video equipment comprising the semiconductor integrated circuit of claim 29.

31. Communication equipment comprising the semiconductor integrated circuit of claim 29.

* * * * *